US008102357B2

(12) United States Patent
Kajiwara et al.

(10) Patent No.: US 8,102,357 B2
(45) Date of Patent: Jan. 24, 2012

(54) DISPLAY DEVICE

(75) Inventors: Hisayoshi Kajiwara, Yokohama (JP); Norio Mamba, Kawasaki (JP); Toshio Miyazawa, Chiba (JP); Masahiro Maki, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 958 days.

(21) Appl. No.: 12/100,493

(22) Filed: Apr. 10, 2008

(65) Prior Publication Data

US 2008/0278650 A1 Nov. 13, 2008

(30) Foreign Application Priority Data

Apr. 16, 2007 (JP) ................................ 2007-106938

(51) Int. Cl.
*G09G 3/36* (2006.01)
*H03K 19/0175* (2006.01)

(52) U.S. Cl. ............ 345/100; 345/98; 345/204; 326/83; 326/88

(58) Field of Classification Search .................. 345/204, 345/211, 214, 94, 98, 100; 326/35, 83, 88, 326/93, 119
See application file for complete search history.

(56) References Cited

U.S. PATENT DOCUMENTS

| | | | | |
|---|---|---|---|---|
| 6,788,108 | B2 | 9/2004 | Miyake et al. | |
| 7,202,863 | B2 * | 4/2007 | Kimura et al. | 345/204 |
| 2002/0158666 | A1 * | 10/2002 | Azami et al. | 326/83 |
| 2003/0020520 | A1 * | 1/2003 | Miyake et al. | 327/112 |
| 2003/0067337 | A1 * | 4/2003 | Yin et al. | 327/210 |
| 2008/0315918 | A1 * | 12/2008 | Luo et al. | 326/80 |

FOREIGN PATENT DOCUMENTS

JP 5-224629 9/1993

OTHER PUBLICATIONS

English Translation of JP 05-224629.*

* cited by examiner

*Primary Examiner* — Amare Mengistu
*Assistant Examiner* — Hong Zhou
(74) *Attorney, Agent, or Firm* — Antonelli, Terry, Stout & Kraus, LLP.

(57) ABSTRACT

An inverter includes an input inverter having a high-resistance load and a first transistor and an output buffer including second and third transistors coupled in series. A power supply voltage is provided to satisfy an inequality VDD1>VDD2+Vth where VDD1 is the power supply voltage of the input inverter, VDD2 is the power supply voltage of the output buffer, and Vth is the threshold voltage of the transistors. Use of the high-resistance load allows an output waveform to rise and fall quickly, as well as reduces current consumption.

8 Claims, 10 Drawing Sheets

DISPLAY DEVICE

CLAIM OF PRIORITY

The present application claims priority from Japanese application serial no. 2007-106938 filed on Apr. 16, 2007, the content of which is hereby incorporated by reference into this application.

BACKGROUND OF THE INVENTION

1. Field of the Invention

The present invention relates to a display device, in particular, a liquid crystal display device in which a drive circuit including an inverter circuit is integrated into a panel.

2. Description of the Related Art

Thin film transistor (TFT) liquid crystal display devices in which each pixel includes a switching element have widely been used as a display device of a personal computer or the like. Also, demand for TFT liquid crystal display devices as a display device of a small-size mobile terminal such as a cell phone has been grown. TFT liquid crystal display devices are required to achieve higher image quality and reduce power consumption, as well as strongly required to reduce the cost. In particular, small-size displays for use in a cell phone are required to reduce the cost of their driver LSI (large-scale integrated circuit) for driving a panel, since the cost of the driver LSI occupies a large portion of that of each display.

In order to reduce the cost of a drive LSI, so-called "drive circuit-integrated display devices" in which high-voltage circuits such as a power supply circuit and a drive circuit, which have been integrated into a driver LSI, are formed on a glass substrate in the same process as the process of forming TFTs in each pixel have been developed and commercialized. Integration these high-voltage circuits into the panel allows a logic circuit to be formed in the driver LSI without having to undergoing a high-voltage process. Also, a shrink effect produced by process miniaturization reduces the circuit area. As a result, the cost of the driver LSI is reduced.

On the other hand, a drive circuit is formed on the panel in an N-channel metal-oxide-semiconductor (NMOS) single channel process; therefore, the process cost becomes lower than the cost of a complementary metal-oxide-semiconductor (CMOS) process. While a clock having an amplitude of the order of a dozen or so volts is generally needed in order to drive gate lines in a TFT liquid crystal display device, the amplitude of an output signal of the drive LSI is as small as the order of several volts. For this reason, a level shifter circuit is needed in order to increase the amplitude. Also, multiple clocks are needed in order to operate the integrated drive circuit; therefore, multiple level shifters are required accordingly.

As a level shifter that can be formed in an NMOS single channel process, the circuit described in U.S. Pat. No. 6,788,108 (JP-A-2003-179479) is known. However, this level shifter requires an input signal for increasing an output voltage and an inverted signal for decreasing an output voltage. Use of such a level shifter increases the number of control clock lines of the integrated drive circuit. If the integrated drive circuit also drives the common lines as well as the gate lines, the control clock line number is further increased. Generally, if a drive circuit is integrated into the panel, it is formed on a frame area outside a display area. The lines of control clocks of the integrated drive circuit are disposed in the frame area as well. Therefore, disposition of a large number of control clock lines causes a problem that the size of the frame area is increased. There also occurs another problem that the number of output pins of the driver LSI is increased and thus the cost of the driver LSI is increased.

Among conceivable methods for reducing the number of the control clock lines of the integrated drive circuit is a method of integrating an inverter circuit into the panel and generating an inverted signal to be provided to a level shifter using the integrated inverter circuit. Known as an inverter circuit that can be formed in an NMOS single channel process is the circuit described in JP-A-05-224629.

However, the above-described inverter circuit has a problem that it is significantly affected by manufacturing variations of a threshold voltage Vth, since an input circuit of the inverter circuit employs a diode connection. Specifically, the inverter circuit has a problem that a large Vth delays the rise of an output waveform and a small Vth increases current (through-current) consumption.

In a drive circuit-integrated display device, thin film transistors included in the drive circuit are formed on a glass substrate in the same process as that in which a switching element of each pixel is formed. These transistors have a problem in that they have a larger threshold voltage Vth than that of transistors used in a typical integrated circuit and a problem that there occur large manufacturing variations in Vth of these transistors. Also, these transistors have a problem that they have a larger on-resistance than that of typical transistors. Further, these transistors have a problem that if a high voltage is applied thereto or if a large current is passed therethrough, element characteristics of these transistors tend to deteriorate.

SUMMARY OF THE INVENTION

An advantage of the present invention is to provide an NMOS inverter that is less affected by manufacturing variations in the threshold voltage Vth of transistors or by the ON-resistance of the transistors, causes an output waveform to quickly rise and fall, and reduces current consumption.

According to an aspect of the present invention, a display area for displaying images and a drive circuit for driving the display area are provided on the same substrate. The drive circuit includes a level shifter circuit for increasing the amplitude of control clocks and an inverter circuit for generating inverted clocks to be provided to the level shifter.

The inverter circuit includes an input inverter having a high-resistance load and an output buffer having two transistors coupled in series. The inverter circuit and output buffer receive a power supply voltage VDD1 and a power supply voltage VDD2, respectively. These power supply voltages are set to satisfy the following inequality $$VDD1>VDD2+Vth$$

where Vth is the threshold voltage of the transistors.

According to the present invention, an NMOS inverter circuit is achieved that is less affected by manufacturing variations in the threshold voltage Vth and in which an output waveform rises and falls quickly. Also, by using a high-resistance load, an NMOS inverter circuit is achieved that reduces current consumption and is less affected by the ON-resistance of transistors. By using such an NMOS inverter circuit to generate inverted clocks, which are to be provided to the NMOS level shifter, in the panel, the number of control clock lines of the integrated drive circuit, the size of the frame area, and the number of driver pins are reduced.

BRIEF DESCRIPTION OF THE DRAWINGS

Embodiments of the present invention will be described in detail with reference to the accompanying drawings, wherein.

DETAILED DESCRIPTION OF THE PREFERRED EMBODIMENTS

Figure 1:
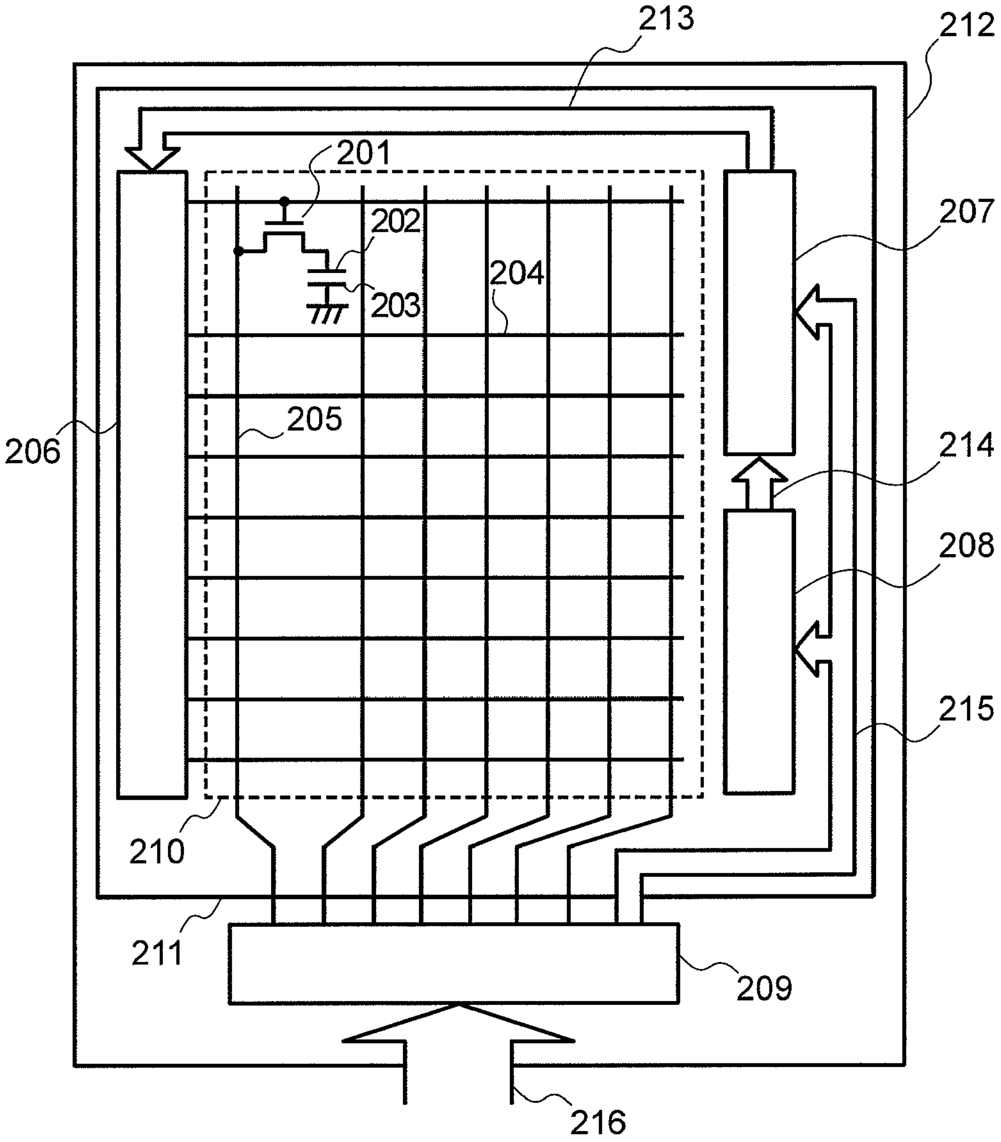
FIG. 1 is a diagram showing a configuration of a display device according to a first embodiment of the invention.

Embodiments of the present invention will now be described with reference to the accompanying drawings. Like components are designated by like reference numerals in these drawings and will not repeatedly be described. Signal lines and corresponding signals will be described using same reference numerals.

First Embodiment

FIG. 1 is a block diagram showing a display device according to a first embodiment of the present invention. In FIG. 1, the display device according to this embodiment includes a liquid crystal panel 211 and a driver LSI 209 for driving the liquid crystal panel both provided on an insulating substrate 212. Disposed on the liquid crystal panel 211 in the horizontal direction and vertical direction are many gate lines 204 and many drain lines 205, respectively. Disposed at an intersection of each gate line 204 and each drain line 205 is a pixel, which includes a pixel electrode 202, a counter electrode 203, and a switching element 201. These components constitute a display area 210. Disposed on the periphery of the display area 210, that is, on the frame area are a power supply circuit 208, a level shifter circuit block 207, and a gate drive circuit 206.

The driver LSI 209 generates a control clock 215 to be provided to the power supply circuit 208 and level shifter circuit block 207 according to a control signal 216 received from the system. The power supply circuit 208 generates various positive or negative power supply voltages 214 required to drive the gate lines and to operate the integrated circuit, and provides the generated voltages to the level shifter circuit block 207 and gate drive circuit 206. The level shifter circuit block 207 converts the control clock 215 having an amplitude of several volts outputted from the driver LSI 209 into a control clock 213 having an amplitude of a dozen or so volts, and provides the converted control clock to the gate drive circuit 206. The gate drive circuit 206 generates a scan signal for turning on the gate lines sequentially line by line, according to the control clock 213 having a large amplitude outputted from the level shifter circuit block 207, and provides the generated scan signal to the gate lines 204. Each time each gate line is turned on, the driver LSI 209 provides an analog gradation voltage corresponding to display data for each line to the pixel electrode 202 via the switching element 201 so as to display an image.

Figure 2:
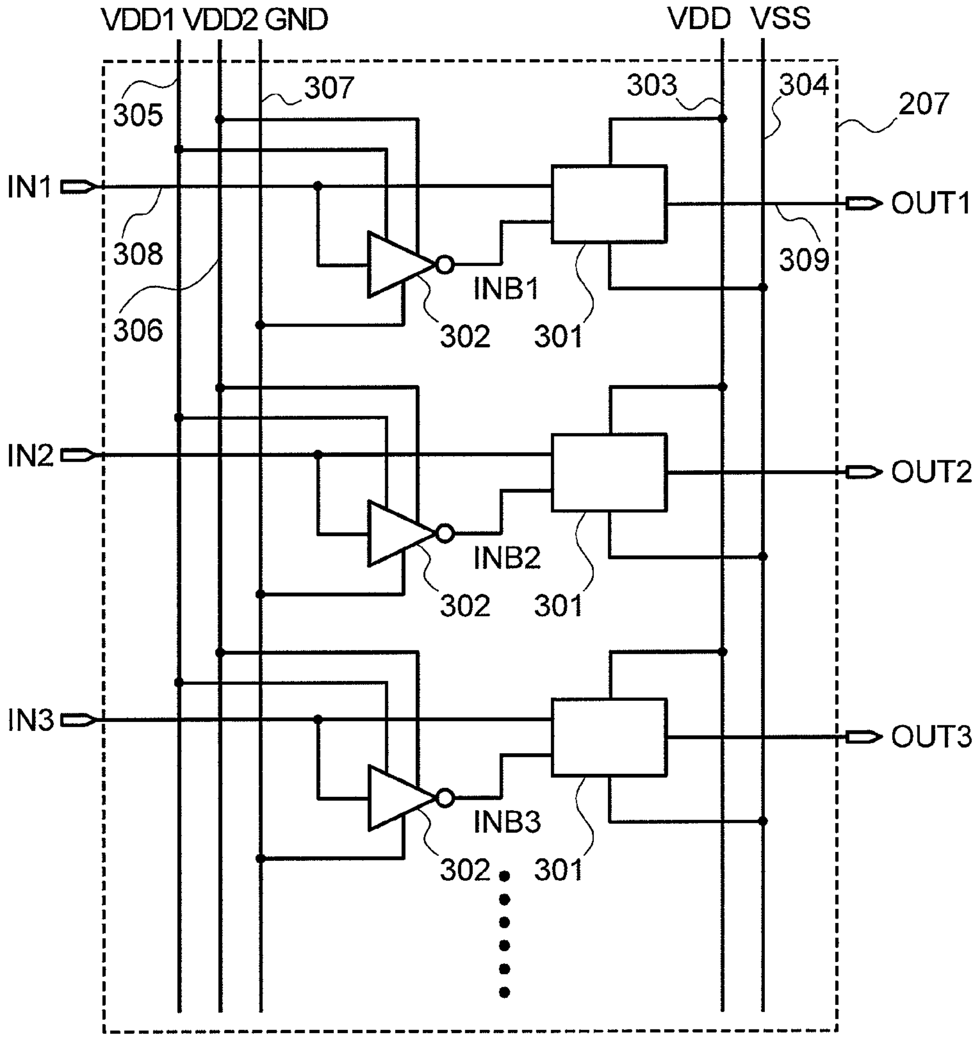
FIG. 2 is a diagram showing a configuration of a level shifter circuit block 207 shown in FIG. 1.

FIG. 2 is a diagram showing a configuration of the level shifter circuit block 207 shown in FIG. 1. In FIG. 2, the level shifter circuit block 207 includes a level shifter circuit 301 for increasing the amplitude of a control clock outputted from the driver LSI 209 shown in FIG. 1 and an inverter circuit 302 for generating an inverted signal INB required to operate the level shifter circuit 301. These circuits are provided by the same number as the number of control clocks required to operate the gate drive circuit 206 shown in FIG. 1, and formed in an NMOS single channel process. The level shifter circuit 301 receives a positive power supply voltage VDD 303 and a negative power supply voltage VSS 304 outputted from the power supply circuit 208 shown in FIG. 1. A difference voltage VDD−VSS between the VDD and VSS is set to a dozen or so volts. The level shifter circuit 301 converts the control clock 215 having an amplitude of several volts outputted from the driver LSI 209 shown in FIG. 1 into a control clock having a large amplitude that is a difference voltage VDD−VSS, and provides the converted clock to the gate drive circuit 206.

In general, a level shifter circuit including an NMOS single channel transistor requires an input signal for increasing an output voltage and an inverted signal for decreasing an output voltage. Accordingly, integration of such a circuit into the panel presents a problem that the number of lines of the integrated circuit is increased compared with a case where a level shifter circuit that includes a CMOS and operates according to a single input signal is used.

To address this problem, the NMOS inverter circuit 302 according to this embodiment is integrated into the panel so that an inverted signal to be provided to the NMOS level shifter circuit 301 is generated using the NMOS inverter circuit 302, as shown in FIG. 2. The NMOS inverter circuit 302 receives a power supply voltage VDD1 305 that is a large voltage outputted from the power supply circuit 208 shown in FIG. 1 and a power supply voltage VDD2 306 that is a relatively small voltage outputted from the driver LSI 209. The NMOS inverter circuit 302 operates among these power supply voltages and a GND level.

Figure 3:
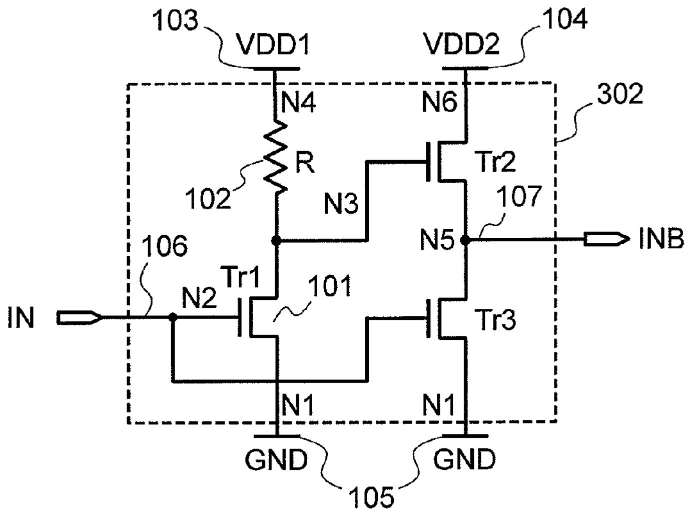
FIG. 3 is a diagram showing a configuration of an inverter circuit 302 shown in FIG. 2.

FIG. 3 is a diagram showing a configuration of the inverter circuit 302 shown in FIG. 2. In FIG. 3, the inverter 302 includes an input inverter having a high-resistance load R 102 and a transistor Tr1 101 and an output buffer having transistors Tr2 and Tr3. The sources of the transistors Tr1 and Tr3 are each coupled to a ground terminal GND 105. A power supply voltage VDD1 103 outputted from the power supply circuit 208 shown in FIG. 1 is provided to the resistance load R. A power supply voltage VDD2 104 outputted from the driver LSI 209 shown in FIG. 1 is provided to the transistor Tr2. In this case, the power supply voltage VDD2 is provided to the transistor Tr2 so to satisfy the following inequality $$VDD1 > VDD2 + Vth$$

where Vth is the threshold voltage of the transistor Tr2.

The inverter circuit 302 shown FIG. 3 uses the high-resistance load in the input inverter thereof; therefore, the inverter circuit is less affected by manufacturing variations in the threshold voltage Vth than a related-art inverter circuit that uses a diode connection load. Specifically, use of a diode connection load causes a problem that a large Vth delays the rise of an output waveform and a small Vth increases current (through-current) consumption of the input inverter. The inverter circuit 302 shown in FIG. 3 solves this problem.

Also, the inverter circuit 302 shown in FIG. 3 includes the output buffer having the transistors Tr2 and Tr3 on the output side thereof and this output buffer is used to charge or discharge a load. Therefore, the inverter circuit 302 drives a large capacitance load faster than an inverter circuit including no output buffer, without being affected by a CR time constant based on the resistance load R of the input inverter and a capacitance C of a load driven by the output buffer. In other words, even if the resistance load R or capacitance load C is large, an output waveform of the inverter circuit 302 rises quickly.

The value of the resistance load R is determined in consideration of the ON-resistance of the transistor TR1. Specifically, a voltage VN3 of a node N3 at a time when the potential of an input clock IN 106 is high is obtained by dividing the power supply voltage VDD1 by the resistance load R and an ON-resistance Ron of the TR1, that is, the voltage VN3 is given by VN3=VDD1×Ron/(R+Ron). Therefore, the value of the resistance load R must be sufficiently larger than the ON-resistance Ron of the Tr1. If the value of the resistance load R is small, the voltage VN3 of the node N3 at a time when the potential of the input clock IN 106 is high is not lowered down to a GND level. Thus, the transistors Tr2 and Tr3 included in the output buffer are both turned on so that a through-current passes through the output buffer.

In general, thin film transistors used in a drive circuit-integrated display device have a problem that these transistors have larger ON-resistances than those of typical transistors. For example, assume that the gate width of the transistor TR1 is several tens of micrometers and the gate length is several micrometers. If a gate-source voltage VGS is 5V, the ON-resistance Ron of the Tr1 becomes several tens of kilo-ohms. Therefore, the resistance load R must be 1 MΩ or more in order to decrease the VN1.

Here, if a polysilicon resistance is used as the resistance load R, a resistance value of several mega-ohms is easily achieved. In this case, the voltage VN3 of the node N3 at a time when the potential of the input clock IN 106 is high is made sufficiently small. This prevents a through-current from passing through the output buffer, as well as reduces the current consumption of the input inverter.

In the inverter circuit 302 shown in FIG. 3, when the potential of the input clock IN becomes low, the potential of the node N3 is raised up to the VDD1, the transistor Tr2 is turned on, and the potential of the output clock INB 107 is increased. At that time, the potential of the output clock INB is made lower than that of the node N3 due to the threshold voltage Vth of the transistor Tr2.

According to this embodiment, however, a power supply voltage is provided to satisfy the inequality VDD1>VDD2+Vth; therefore, the potential of the node N3 at a time when the potential of the input clock IN is low becomes higher than VDD2+Vth so that the potential of the output clock INB is surely increased up to the power supply voltage VDD2 of the output buffer. As a result, the inverter circuit 302 outputs an inverted signal waveform having an amplitude equal to that of the power supply voltage VDD2 provided by the driver LSI 209 shown in FIG. 1, without being affected by a voltage drop due to the threshold voltage Vth of the transistor Tr2. Also, by making the VDD1 larger than the VDD2, an output waveform rises more quickly.

In FIG. 3, a first terminal of the first transistor Tr1 is coupled to a first node N1, a gate terminal thereof is coupled to a second node N2, and a second terminal thereof is coupled to the third node N3. A first terminal of the second transistor Tr2 is coupled to a fifth node N5, a gate terminal thereof is coupled to the third node N3, and a second terminal thereof is coupled to a sixth node N6. A first terminal of the third transistor Tr3 is coupled to the first node N1, a gate terminal thereof is coupled to the second node N2, and a second terminal thereof is coupled to the fifth node N5.

Also, a first terminal of the high-resistance element R is coupled to a fourth node N4 and a second terminal thereof is coupled to the third node N3. A first power supply voltage VDD1 is provided between the fourth node N4 and first node N1. A second power supply voltage VDD2 is provided between the sixth node N6 and first node N1. Thus, the input clock IN is inputted into the second node N2 and the inverted output clock INB is outputted from the fifth node N5.

Figure 4:
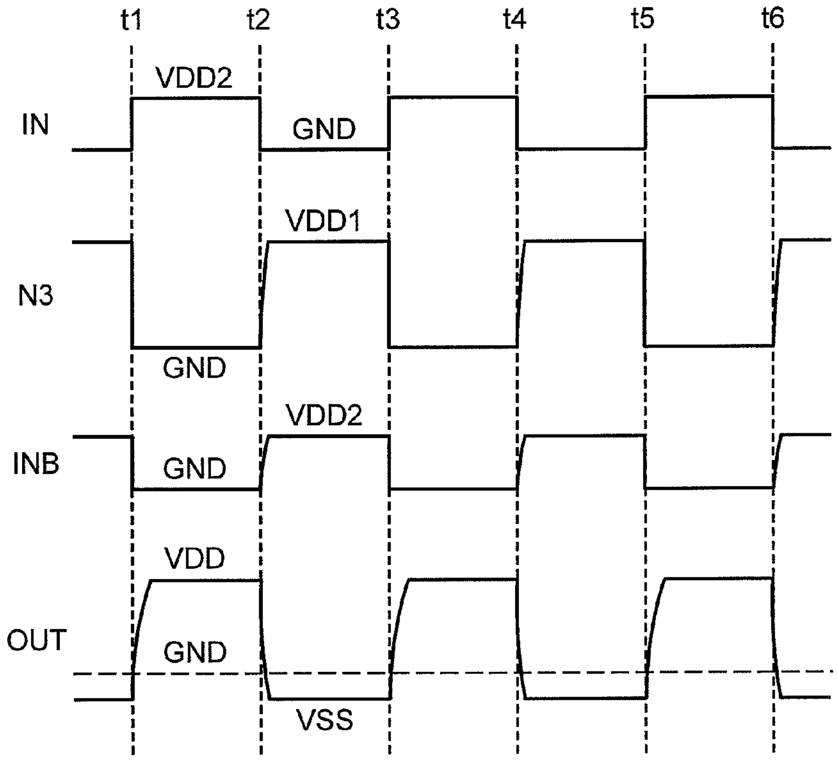
FIG. 4 is a diagram showing an input waveform and an output waveform of the inverter circuit 302 shown in FIG. 3.

FIG. 4 is a diagram showing waveforms of the input clock and output clock of the inverter circuit 302 and a waveform of an output clock of the level shifter circuit 301. Here, the driver LSI 209 shown in FIG. 1 outputs a control clock having an amplitude VDD2 whose high level is the VDD2 and whose low level is the GND, and the outputted control clock is provided as an input clock IN to the inverter circuit 302.

In FIG. 4, first, the input clock IN rises at a time t1. At that time, the Tr1 shown in FIG. 3 is turned on so that a current flows into the input inverter via the high-resistance load R. As a result, the potential of the node N3 is lowered down to almost the GND level so that the TR2 is turned off. On the other hand, the Tr3 is turned on so that the load is discharged via the Tr3. As a result, the output clock INB is lowered down to almost the GND level.

Subsequently, the potential of the input clock IN is lowered at a time t2. At that time, the Tr1 is turned off so that the current in the input inverter becomes almost zero. As a result, the potential of the node N3 is raised up to the power supply voltage VDD1 of the input inverter. At that time, the Tr3 is also turned off. The increase in potential of the node N3 turns on the Tr2 so that a current is provided to the load via the Tr2. Thus, the potential of the output clock INB is raised. Since the power supply voltages VDD1 and VDD2 are set so that VDD1>VDD2+Vth, the increase in potential of the node N3 up to the VDD1 allows the potential of the output clock INB to be increased up to the power supply voltage VDD2 of the output buffer without being affected by the threshold voltage Vth of the Tr2. By repeating the above-described operations, an inverted clock INB having an amplitude VDD2 is obtained.

The NMOS level shifter circuit 301 operates according to a control clock (input clock IN) outputted from the driver LSI 209 shown in FIG. 1 and the inverted clock INB outputted from the inverter circuit, and thus charges or discharges the load. Specifically, a rise in potential of the input clock IN causes the potential of an output OUT shown in FIG. 4 to rise from the VSS to the VDD; a rise in potential of the inverted clock INB causes the potential of an output OUT to fall from the VDD to the VSS. Thus, the output waveform of the NMOS level shifter circuit 301 becomes a clock waveform having a large amplitude that is a difference voltage VDD−VSS.

Second Embodiment

An inverter circuit according to a second embodiment of the present invention includes two output buffers. Thus, the inverter circuit is less affected by the CR time constant based on the resistance load R and a transistor parasite capacitance C included in the inverter circuit. Also, even if the resistance load R is increased, an output waveform of the inverter circuit rises and falls quickly. This embodiment will be described below with reference to FIGS. 5 and 6. The configuration of this embodiment except for that of the inverter circuit is the same as that of the first embodiment and will not be described.

Figure 5:
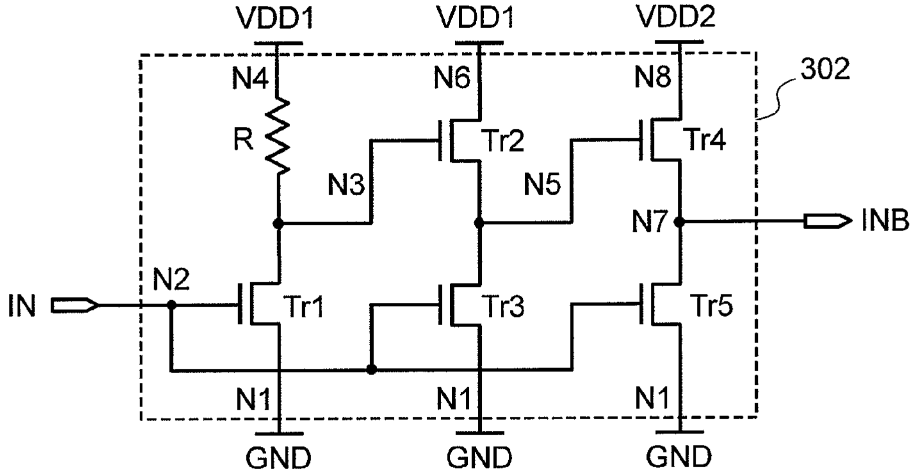
FIG. 5 is a diagram showing another configuration of the inverter circuit 302 shown in FIG. 2.

FIG. 5 is a diagram showing a configuration of the inverter circuit according to this embodiment. In FIG. 5, the inverter circuit 302 includes an input inverter having the high-resistance load R and transistor Tr1, an intermediate buffer having the transistors Tr2 and Tr3, and an output buffer having transistors Tr4 and Tr5. The sources of the transistors Tr1, tR3, and Tr5 are each coupled to the ground terminal GND 105. The power supply voltage VDD1 outputted from the power supply circuit 208 shown in FIG. 1 is provided to the high-resistance load R and transistor Tr2. The power supply voltage VDD2 outputted from the driver LSI 209 is provided to the transistor Tr4. These power supply voltages are set to satisfy the inequality VDD1>VDD2+Vth.

Specifically, the power supply voltage VDD1 provided to the high-resistance load R is set to a value larger than the sum of the power supply voltage VDD2 and twice the threshold voltage Vth. The power supply voltage VDD1 provided to the transistor Tr2 is preferably set to a value larger than the sum of the power supply voltage VDD2 and threshold voltage Vth.

In the inverter circuit 302, the output buffer including the Tr4 and Tr5 drives the load and the intermediate buffer including the Tr2 and Tr3 drives only the gate of the Tr4. Thus, the gate widths of the Tr2 and are set to a value smaller than the gate widths of the and Tr5. This allows a parasite capacitance C of the to be made smaller than that in the first embodiment. As a result, even if the resistance load R is increased, the CR time constant based on the resistance load R and the parasite capacitance C of the Tr2 is limited to a small value.

As a result, the through-current (consumption current) in the input inverter is reduced without delaying the rise of the output waveform. Also, even if the resistance load R is increased due to a manufacturing variation thereof, the parasite capacitance C of the TR2 is prevented from delaying a rise in potential of the node N3. Also, since a power supply voltage is set so that VDD1>VDD2+Vth, the potential of the node N5 becomes larger than VDD2+Vth when the potential of the input clock IN is low. Therefore, an inverted clock waveform having the amplitude VDD2 is outputted without suffering a reduction in output voltage due to the threshold voltage Vth of the Tr4.

In FIG. 5, the first terminal of the first transistor Tr1 is coupled to the first node N1, the gate terminal thereof is coupled to the second node N2, and the second terminal thereof is coupled to the third node N3. The first terminal of the second transistor Tr2 is coupled to the fifth node N5, the gate terminal thereof is coupled to the third node N3, and the second terminal thereof is coupled to the sixth node N6. The first terminal of the third transistor Tr3 is coupled to the first node N1, the gate terminal thereof is coupled to the second node N2, and the second terminal thereof is coupled to the fifth node N5. A first terminal of a fourth transistor Tr4 is coupled to a seventh node N7, a gate terminal thereof is coupled to the fifth node N5, and the second terminal thereof is coupled to a eighth node N8. A first terminal of a fifth transistor Tr5 is coupled to the first node N1, a gate terminal thereof is coupled to the second node N2, and a second terminal thereof is coupled to the seventh node N7.

Also, the first terminal of the high-resistance element R is coupled to the fourth node N4 and the second terminal thereof is coupled to the third node N3. A first power supply voltage VDD1 is provided between the fourth node N4 and first node N1. A second power supply voltage VDD1 is provided between the sixth node N6 and first node N1. A third power supply voltage VDD2 is provided between the eighth node N8 and first node N1. Thus, an input clock IN is inputted into the second node N2 and an inverted output clock INB is outputted from the seventh node N7.

Figure 6:
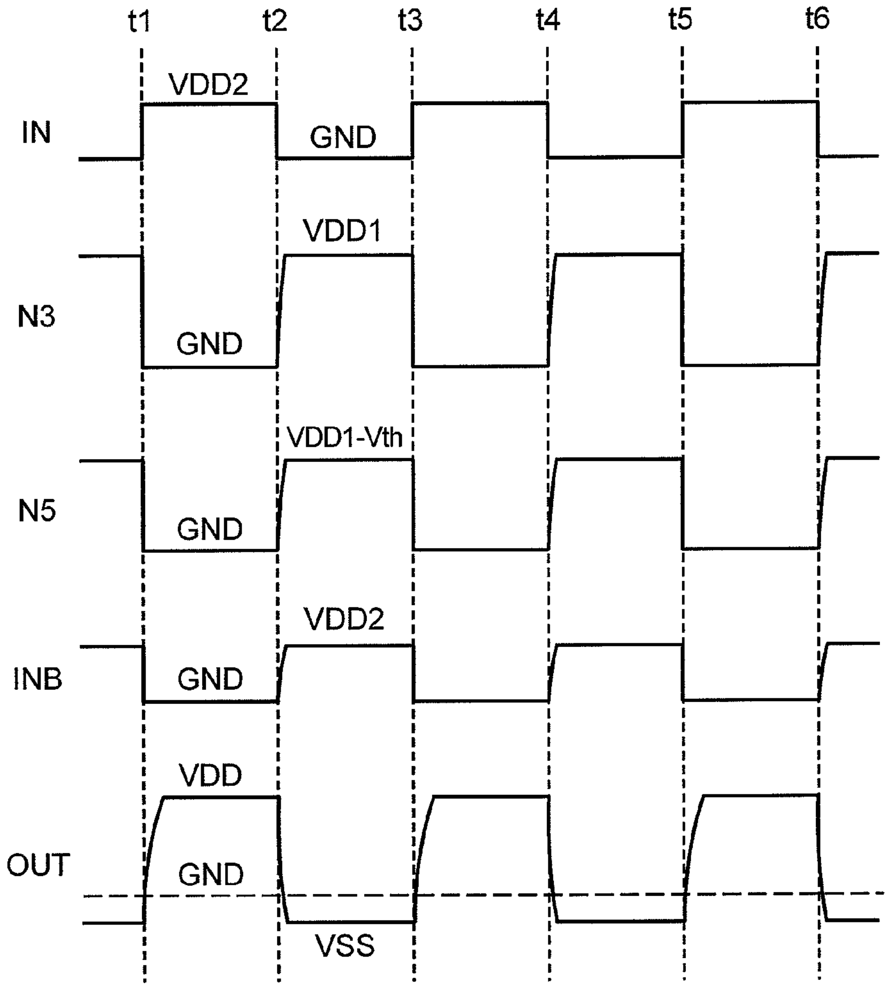
FIG. 6 is a diagram showing an input waveform and an output waveform of the inverter circuit 302 shown in FIG. 5.

FIG. 6 is a diagram showing an input waveform and an output waveform of the inverter circuit 302 and an output waveform of the level shifter circuit 301. Here, the driver LSI 209 shown in FIG. 1 outputs a control clock having an amplitude VDD2 whose high level is the VDD2 and whose low level is the GND, and the outputted control clock is provided as an input clock IN to the inverter circuit 302.

In FIG. 6, first, the potential of the input clock IN is raised at the time t1. At that time, the Tr1 shown in FIG. 5 is turned on so that a current flows into the input inverter via the high-resistance load R. As a result, the potential of the node N3 is lowered down to almost the GND level so that the Tr2 is turned off. On the other hand, the Tr3 and Tr5 are turned on so that the potentials of the node N5 and output clock INB are lowered down to almost the GND level.

Subsequently, the potential of the input clock IN is lowered at the time t2. At that time, the Tr1 is turned off so that the current in the input inverter becomes almost zero. As a result, the potential of the node N3 is raised up to the power supply voltage VDD1 of the input inverter. At that time, the Tr3 and Tr5 are also turned off. The increase in potential of the node N3 up to the VDD1 turns on the Tr2 so that the potential of the node N5 is raised up to VDD1−Vth. Since a power supply voltage is set so that VDD1>VDD2+2Vth, the potential of the node N5 becomes larger than VDD2+Vth. Thus, the potential of the output clock INB is raised up to the power supply voltage VDD2 of the output buffer without being affected by the threshold voltage Vth of the Tr4. By repeating the above-described operations, an inverted clock INB having an amplitude VDD2 is obtained.

The NMOS level shifter circuit 301 operates according to a control clock (input clock IN) outputted from the driver LSI 209 shown in FIG. 1 and the inverted clock INB outputted from the inverter circuit, and thus charges or discharges the load. Specifically, a rise in potential of the input clock IN causes the potential of an output OUT shown in FIG. 6 to rise from the VSS to the VDD; a rise in potential of the inverted clock INB causes the potential of an output OUT to fall from the VDD to the VSS. Thus, the output waveform of the NMOS level shifter circuit 301 becomes a clock waveform having a large amplitude that is a difference voltage VDD−VSS.

Third Embodiment

In an third embodiment of the present invention, the power supply voltage VDD of the level shifter circuit block 207 is used instead of the power supply voltage VDD1 that is a higher one of the power supply voltages used by the inverter circuit. This reduces the number of power supply voltages required to operate the integrated circuit, thereby reducing the number of control clocks of the integrated circuit.

Figure 7:
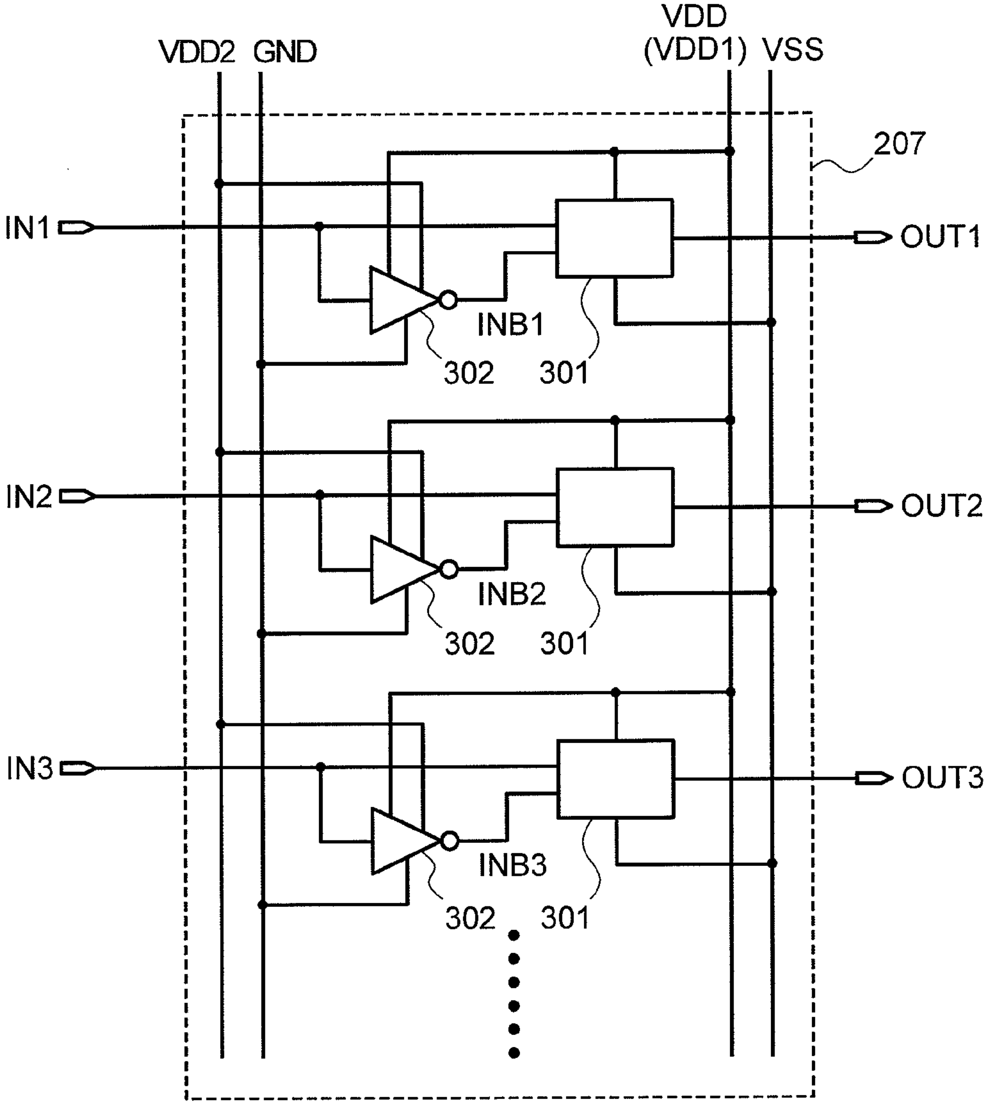
FIG. 7 is a diagram showing another configuration of the level shifter circuit block 207 shown in FIG. 1.

FIG. 7 is a diagram showing a configuration of the level shifter circuit block 207 according to this embodiment. In FIG. 7, the level shifter circuit block 207 includes the level shifter circuit 301 for increasing the amplitude of a control clock outputted from the driver LSI 209 shown in FIG. 1 and the inverter circuit 302 for generating an inverted clock INB required to operate the level shifter circuit 301. The inverter circuit 302 is the same as that used in the first or second embodiment, so the configuration and operation thereof will not be described.

According to this embodiment, in order to reduce the number of power supply voltages required to operate the integrated circuit, the power supply voltage VDD outputted from the power supply circuit 208 shown in FIG. 1 is provided to a power supply terminal of the level shifter circuit 301 as well as to a power supply terminal (VDD1) of the inverter circuit 302 for receiving a higher voltage, as shown in FIG. 7. Thus, the power supply voltage VDD is shared by these circuits. This eliminates the need for independently providing a power supply circuit for creating a higher one (VDD1) of the power supply voltages used by the inverter circuit 302. As a result, the number of the power supply circuits included in the panel is made smaller than those in the first and second embodiments.

In general, the power supply voltage VDD of the level shifter circuit 301 must be a high voltage of several to a dozen or so volts in order to perform switching of the TFT in each pixel. If such a high power supply voltage is applied to a related-art inverter circuit that uses a diode connection load, the through-current (consumption current) in the inverter circuit is significantly increased. Therefore, such a related-art inverter circuit cannot be used. On the other hand, the inverter circuit according to this embodiment includes a high-resistance load. In particular, if a polysilicon resistance is used as the high-resistance load, a high resistance of several megaohms is easily achieved. Therefore, even if such a high voltage is provided to the inverter circuit, the through-current is limited to a small amount.

In general, if a power supply circuit includes a semiconductor element, a DC/DC converter for converting a low input voltage into a high voltage using a charge pump circuit and outputting the converted high voltage is required. The charge pump circuit here refers to a circuit for temporarily charging a capacitance element with an input voltage and then increasing the charged voltage using a clock so as to obtain a high output voltage. The charge pump circuit requires many clocks to perform switching and increase the voltage. Accordingly, integration of such a power supply circuit into the panel increases the number of control clock lines of the integrated circuit.

According to this embodiment, the power supply voltage VDD of the level shifter circuit 301 is used instead of the power supply voltage VDD1 that is a higher one of the power supply voltages used by the inverter circuit. This eliminates the need for independently providing a power supply circuit for generating the VDD1 in the panel, thereby making the number of control clock lines of the integrated circuit smaller than those in the first and second embodiments.

Fourth Embodiment

According to a fifth embodiment of the present invention, a bootstrap circuit is used as the inverter circuit. This prevents a reduction in output voltage due to the threshold voltage Vth, as well as allows the inverter circuit to operate by a relatively small, single power supply voltage outputted from the driver LSI.

Figure 8:
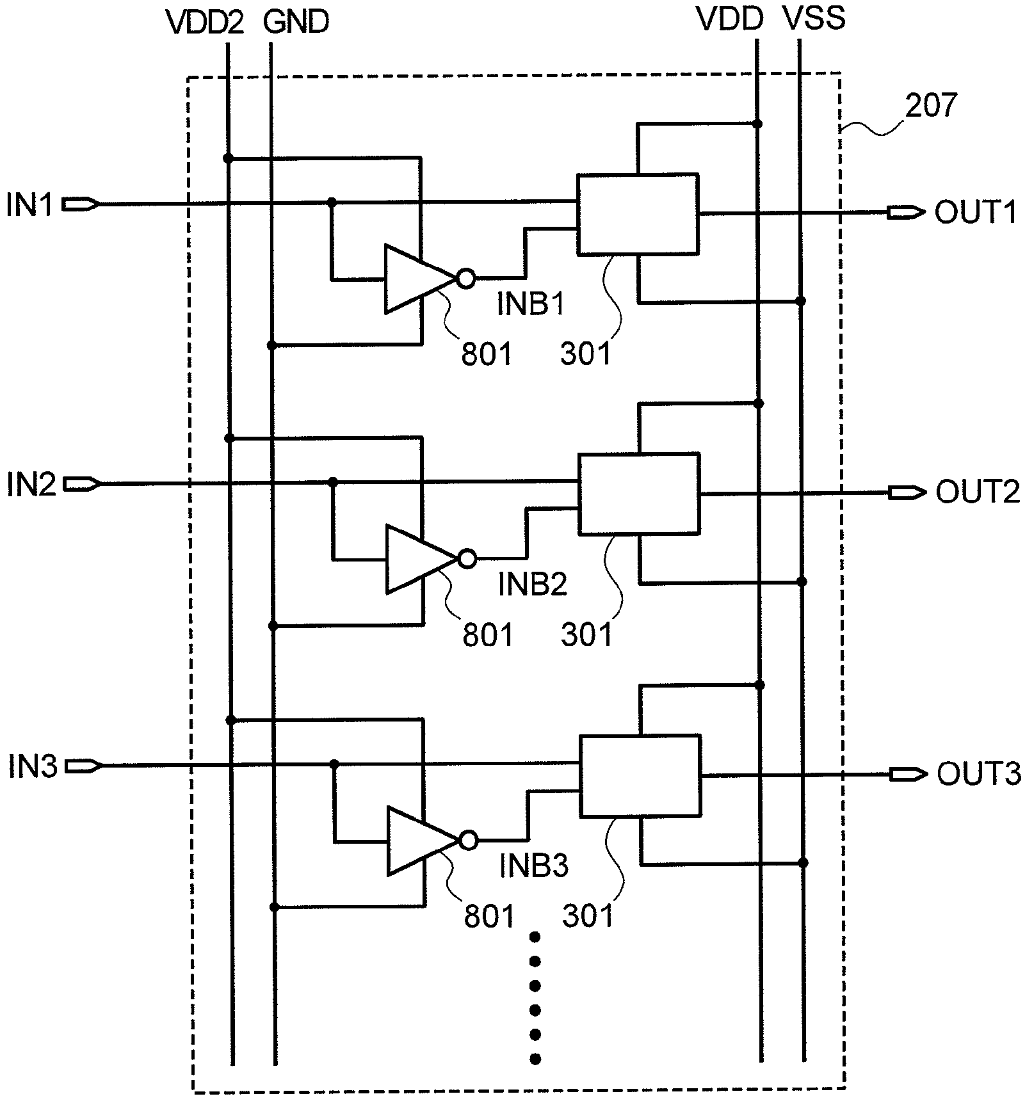
FIG. 8 is a diagram showing another configuration of the level shifter circuit block 207 shown in FIG. 1.

FIG. 8 is a diagram showing a configuration of the level shifter circuit block 207 according to this embodiment. In FIG. 8, the level shifter circuit block 207 includes the level shifter circuit 301 for increasing the amplitude of a control clock outputted from the driver LSI 209 shown in FIG. 1 and an inverter circuit 801 for generating an inverted clock INB required to operate the level shifter circuit 301. The level shifter circuit 301 receives power supply voltages VDD and VSS outputted from the power supply circuit 208 shown in Fig. The inverter circuit 801 receives only a power supply voltage VDD that is a relatively small voltage outputted from the driver LSI 209 shown in FIG. 1.

Figure 9:
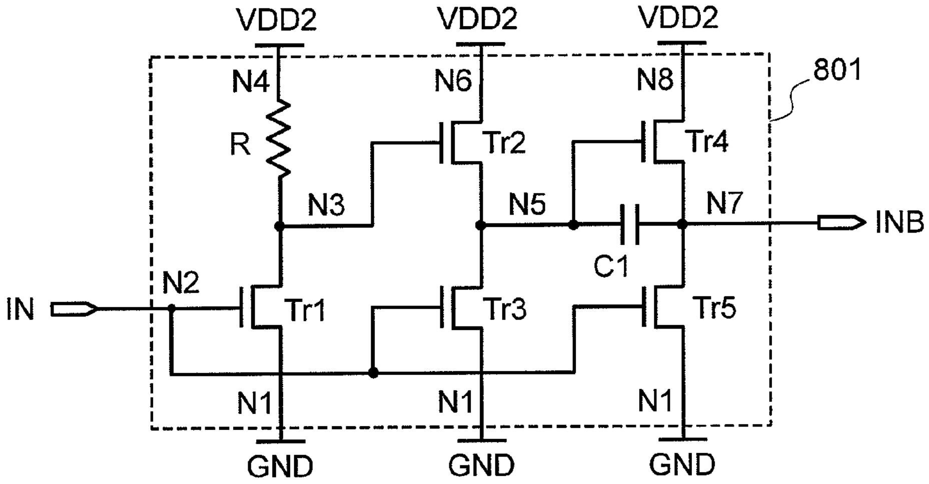
FIG. 9 is a diagram showing a configuration of an inverter circuit 801 shown in FIG. 8.

FIG. 9 is a diagram showing a configuration of the inverter circuit 801 according to this embodiment. In FIG. 9, the inverter circuit 801 includes an input inverter having the high-resistance load R and transistor Tr1, an intermediate buffer having the transistors Tr2 and Tr3, and an output buffer having the transistors Tr4 and Tr5 and a capacitance C1.

The capacitance C1 here refers to a capacitance for bootstrap and is provided to prevent the threshold voltage Vth from reducing the output voltage of the inverter circuit 801. The sources of the transistors Tr1, Tr3, and Tr5 are each coupled to the ground terminal GND. The resistance load R and transistors Tr2 and Tr4 each receive a power supply voltage VDD2 that is a relatively small voltage outputted from the driver LSI 209 shown in FIG. 1.

In FIG. 9, a rise in potential of an input clock IN raises the potentials of the nodes N3 and N5 so that a bootstrap capacitance C1 is charged with a voltage VC1. Thus, the Tr4 is turned on by the charged voltage VC1 and a current is provided to the load via the Tr4 with the charged voltage VC1 held by the capacitance C1. As a result, the potential of the node N5 is raised up to the VDD2+VC1 and the potential of the output clock INB is raised up to the VDD2 without suffering a voltage drop due to the Vth of the Tr4. Thus, an inverted clock waveform having an amplitude VDD2 is outputted using only the power supply voltage VDD2 that is a relatively small voltage.

In FIG. 9, the first terminal of the first transistor Tr1 is coupled to the first node N1, the gate terminal thereof is coupled to the second node N2, and the second terminal thereof is coupled to the third node N3. The first terminal of the second transistor Tr2 is coupled to the fifth node N5, the gate terminal thereof is coupled to the third node N3, and the second terminal thereof is coupled to the sixth node N6. The first terminal of the third transistor Tr3 is coupled to the first node N1, the gate terminal thereof is coupled to the second node N2, and the second terminal thereof is coupled to the fifth node N5. The first terminal of the fourth transistor Tr4 is coupled to the seventh node N7, the gate terminal thereof is coupled to the fifth node N5, and the second terminal thereof is coupled to the eighth node N8. The first terminal of the fifth transistor Tr5 is coupled to the first node N1, the gate terminal thereof is coupled to the second node N2, and the second terminal thereof is coupled to the seventh node N7.

Also, the first terminal of the high-resistance element R is coupled to the fourth node N4 and the second terminal thereof is coupled to the third node N3. A first terminal of the capacitance element C1 is coupled to the seventh node N7 and a second terminal thereof is coupled to the fifth node N5. A first power supply voltage VDD2 is provided between the fourth node N4 and first node N1. A second power supply voltage VDD2 is provided between the sixth node N6 and first node N1. A third power supply voltage VDD2 is provided between the eighth node N8 and first node N1. Thus, an input clock IN is inputted into the second node N2 and an inverted output clock INB is outputted from the seventh node N7.

According to this embodiment, the inverter circuit operates by only the power supply voltage VDD2 that is a relatively small voltage outputted from the driver LSI 209. This eliminates the need for independently providing a high-voltage power supply circuit for operating the inverter circuit in the panel, thereby making the number of control clock lines of the integrated drive circuit smaller than those in the first and second embodiments. Also, the power supply voltage of the inverter circuit is made smaller than those in the first to third embodiments. This prevents characteristic deterioration of the thin film transistors due to application of a high voltage.

Figure 10:
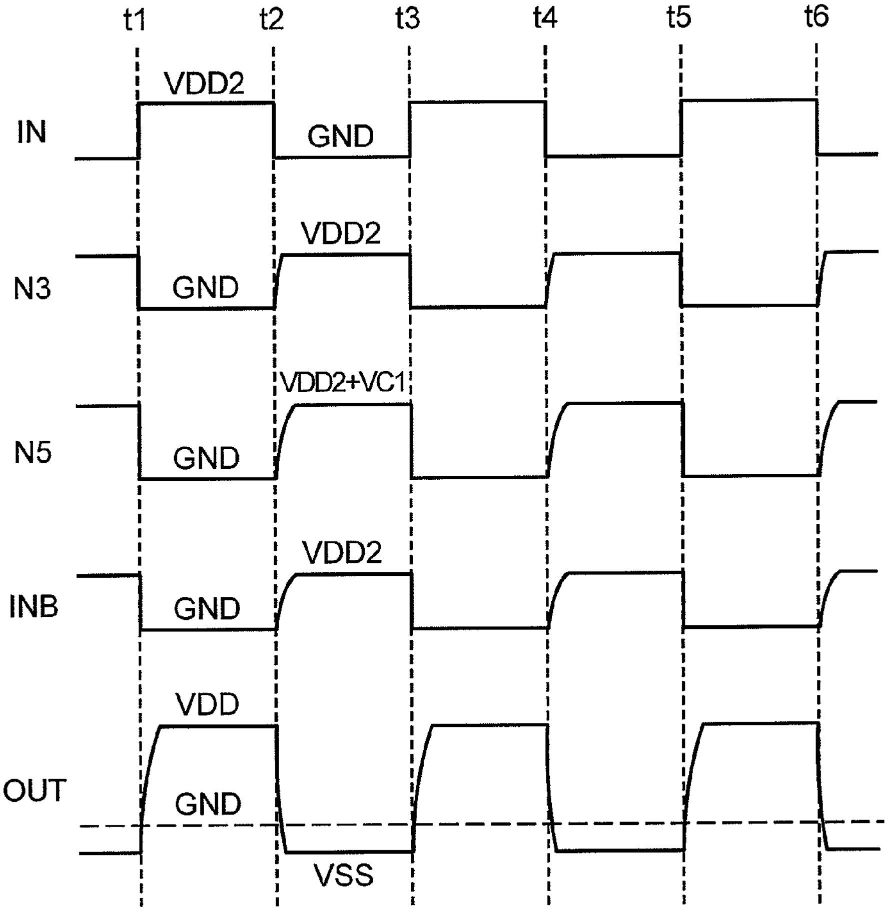
FIG. 10 is a diagram showing an input waveform and an output waveform of the inverter circuit 801 shown in FIG. 9.

FIG. 10 is a diagram showing an input waveform and an output waveform of the inverter circuit 801 and an output waveform of the level shifter circuit 301. Here, the driver LSI 209 shown in FIG. 1 outputs a control clock having an amplitude VDD2 whose high level is the VDD2 and whose low level is the GND, and the outputted control clock is provided as an input clock IN to the inverter circuit 801.

In FIG. 10, first, the potential of the input clock IN is raised at the time t1. At that time, the Tr1 shown in FIG. 9 is turned on so that a current flows into the input inverter via the high-resistance load R. As a result, the potential of the node N3 is lowered down to almost the GND level so that the Tr2 is turned off. On the other hand, the Tr3 and Tr5 are turned on so that the potentials of the node N5 and output clock INB are lowered down to almost the GND level.

Subsequently, the potential of the potential of the input clock IN is lowered at the time t2. At that time, the Tr1 is turned off so that the current in the input inverter becomes almost zero. As a result, the potential of the node N3 is raised up to the power supply voltage VDD2. At that time, the Tr3 and Tr5 are also turned off. The increase in potential of the node N3 turns on the Tr2 so that the capacitance C1 is charged with the voltage VC1 via the Tr2. Thus, the Tr4 is turned on so that a current is provided to the load via the Tr4 with the voltage VC1 held by the capacitance C1. As a result, the potential of the node N5 is raised up to the VDD2+VC1 and the potential of the output clock INB is raised up to the VDD2 without being affected by the threshold voltage Vth of the Tr4. Although the potential of the node N5 becomes higher than the VDD2 at that time, the electric charge of the capacitance C1 does not leak via the Tr2 and the capacitance C1 holds the charged voltage VC1. This is because the Tr2 acts as a reverse bias. By repeating the above-described operations, an inverted clock INB having an amplitude VDD2 is obtained.

As with the first to third embodiments, the NMOS level shifter circuit 301 operates according to a control clock (input clock IN) outputted from the driver LSI 209 shown in FIG. 1 and the inverted clock INB outputted from the inverter circuit, and thus charges or discharges the load. Specifically, a rise in potential of the input clock IN causes the potential of an output OUT shown in FIG. 10 to rise from the VSS to the VDD; a rise in potential of the inverted clock INB causes the potential of the output OUT to fall from the VDD to the VSS. Thus, the output waveform of the NMOS level shifter circuit 301 becomes a clock waveform having a large amplitude that is a difference voltage VDD−VSS.

Fifth Embodiment

According to a fifth embodiment of the present invention, a bootstrap circuit configured to receive a large power supply voltage VDD is used as an inverter circuit having a level shift function. That is, the inverter circuit according to this embodiment also serves as a level shifter circuit for increasing the amplitude of a control clock outputted from the driver LSI 209. This allows a reduction in number of control clock lines.

Figure 11:
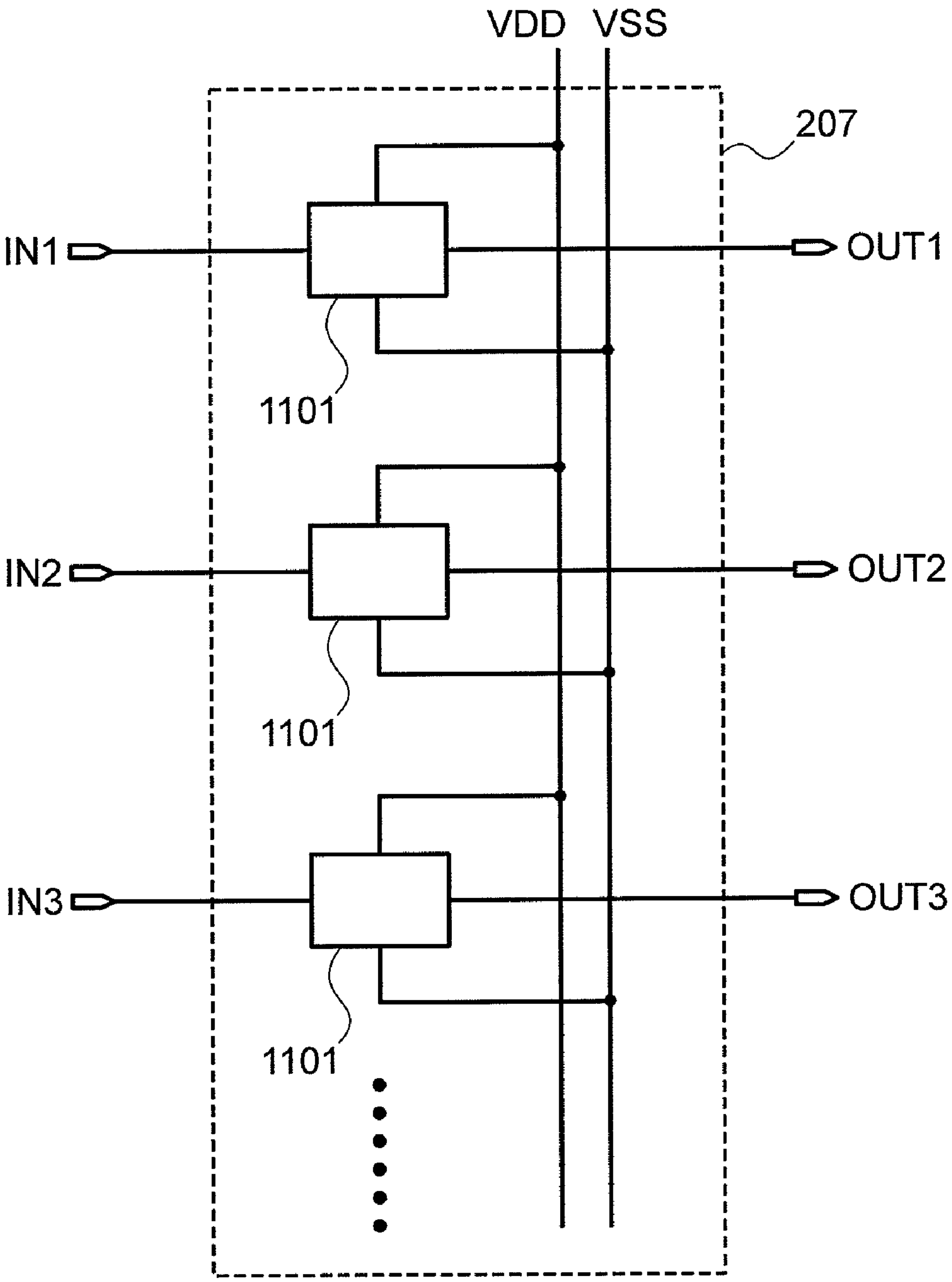
FIG. 11 is a diagram showing another configuration of the level shifter circuit block 207 shown in FIG. 1.

FIG. 11 is a diagram showing a configuration of the level shifter circuit block 207 according to this embodiment. In FIG. 11, the level shifter circuit block 207 includes inverter circuits 1101 that each have a level shift function and are provided by the number of control clocks required to operate the gate drive circuit 206 shown in FIG. 1. The level-shift inverter circuits 1101 each receive power supply voltages VDD and VSS outputted from the power supply circuit 208 shown in FIG. 1. Each level-shift inverter circuit 1101 converts a control clock outputted from the driver LSI 209 shown in FIG. 1 into an inverted clock having a large amplitude and provides the inverted clock to the gate drive circuit 206.

As described above, a control clock is inverted when it passes through the level-shift inverter circuit 1101; however, a control clock may be outputted from the level-shift inverter circuit 110 not as an inverted clock but as a control clock having a large amplitude, by providing another inverter circuit on the output side of the driver LSI 209, inverting the control clock using such another inverter circuit, and inputting the inverted clock into the level-shift inverter circuit 110.

Figure 12:
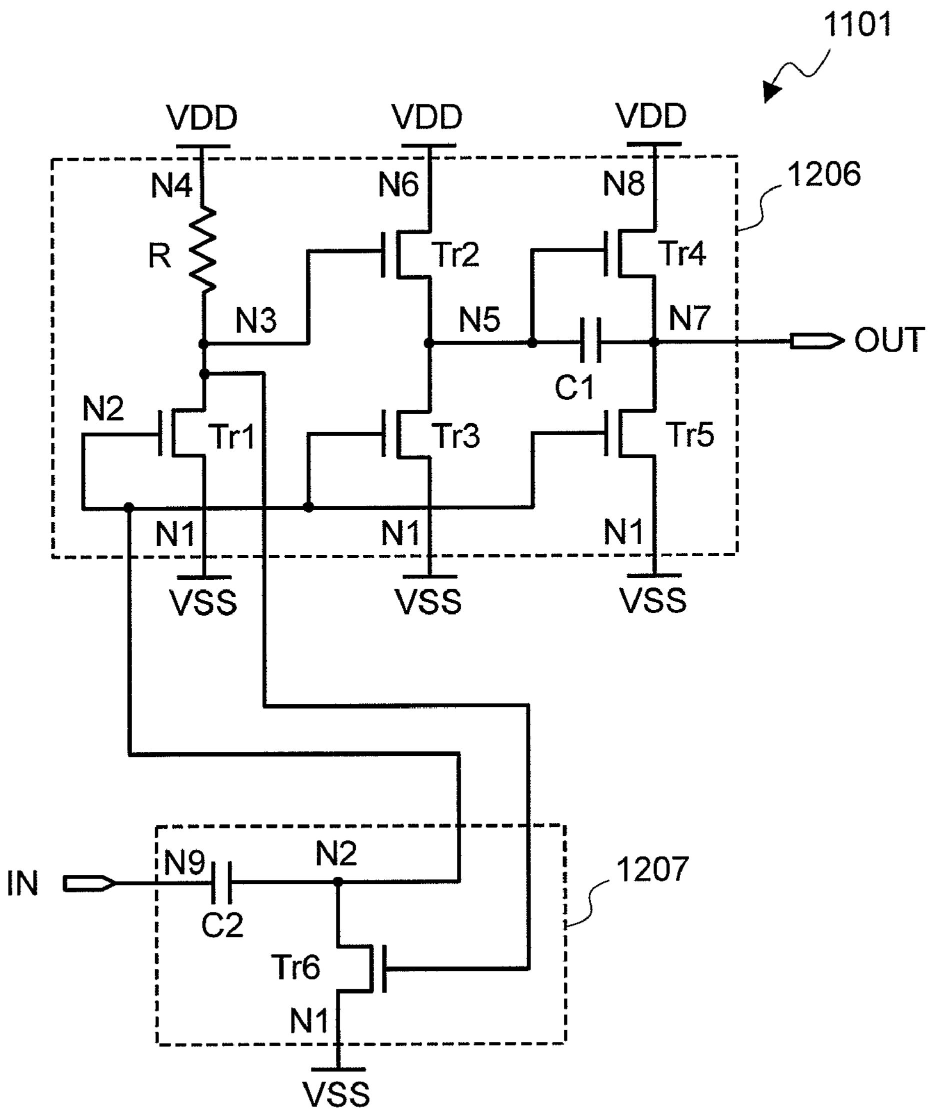
FIG. 12 is a diagram showing a configuration of a level-shift inverter circuit block 1101 shown in FIG. 11.

FIG. 12 is a diagram showing a configuration of the level-shift inverter circuit block 1101 according to this embodiment. In FIG. 12, the level-shift inverter circuit block 1101 includes an inverter circuit 1206 for inverting an input clock IN and converting the inverted input clock IN into a clock having a large amplitude and a DC level conversion circuit 1207 coupled to the driver LSI 209 shown in FIG. 1 via a capacitance C2. The level-shift inverter circuit 1206 includes an input inverter having the high-resistance load R and transistor Tr1, an intermediate buffer having the transistors Tr2 and Tr3, and an output buffer having the transistors Tr4 and Tr5 and a bootstrap capacitance C1. The DC level conversion circuit 1207 includes a transistor Tr6 and a DC-cut capacitance C2. These circuits receive power supply voltages VDD and VSS outputted from the power supply circuit 208 shown in FIG. 1.

In FIG. 12, a fall in potential of the input clock IN lowers the potential of the node N2 via the capacitance C2. Thus, the potentials of the nodes N3 and N5 are raised so that the bootstrap capacitance C1 is charged with the voltage VC1. Thus, the Tr4 is turned on so that a current is provided to the load via the Tr4 with the charged voltage VC1 held by the capacitance C1. As a result, the potential of the node N5 is raised up to the VDD+VC1 and the potential of an output clock INB is raised up to the VDD without suffering a voltage drop due to the Vth of the Tr4. Conversely, a fall in potential of the input clock IN raises the potential of the node N2 so that the Tr1, Tr3, and Tr5 are turned on and the potential of an output clock OUT is lowered down to the VSS. By repeating such operations, a control clock having an amplitude VDD2 outputted from the driver LSI 209 shown in FIG. 1 is converted into an inverted clock required to drive the gate lines and having a large amplitude that is a difference voltage VDD−VSS.

In general, the drive LSI 209 shown in FIG. 1 operates using a GND level as a reference; the inverter circuit 1206 operates using a negative voltage VSS as a reference. To prevent a malfunction due to the difference between the DC levels used as a reference, these circuits are coupled via the DC-cut capacitance C2. Also, the transistor 6 is provided to prevent destabilization of the potential of the node N2. Thus, when the potential of the input clock IN becomes low, the Tr6 and then Tr5 are turned on by the voltage VDD generated at the node N3 so that the potential of the node N5 is surely lowered down to the VSS.

While a case where the gate of the Tr6 is controlled using the voltage of the node N3 is shown in FIG. 12, it is sufficient to provide an inverted clock of the input clock IN to the gate of the Tr6. Therefore, the gate of the Tr6 may be coupled to the node N5 or the output clock OUT.

In FIG. 12, the first terminal of the first transistor Tr1 is coupled to the first node N1, the gate terminal thereof is coupled to the second node N2, and the second terminal thereof is coupled to the third node N3. The first terminal of the second transistor Tr2 is coupled to the fifth node N5, the gate terminal thereof is coupled to the third node N3, and the second terminal thereof is coupled to the sixth node N6. The first terminal of the third transistor Tr3 is coupled to the first node N1, the gate terminal thereof is coupled to the second node N2, and the second terminal thereof is coupled to the fifth node N5. The first terminal of the fourth transistor Tr4 is coupled to the seventh node N7, the gate terminal thereof is coupled to the fifth node N5, and the second terminal thereof is coupled to the eighth node N8. The first terminal of the fifth transistor Tr5 is coupled to the first node N1, the gate terminal thereof is coupled to the second node N2, and the second terminal thereof is coupled to the seventh node N7.

Also, the first terminal of the high-resistance element R is coupled to the fourth node N4 and the second terminal thereof is coupled to the third node N3. The first terminal of the capacitance element C1 is coupled to the seventh node N7 and the second terminal thereof is coupled to the fifth node N5. A first terminal of the second capacitance element C2 is coupled to a ninth node N9, and a second terminal thereof is coupled to the second node N2.

A first terminal of the sixth transistor Tr6 is coupled to the first node N1, a gate terminal thereof is coupled to the third node N3, fifth node N5, or seventh node N7, and a second terminal thereof is coupled to the second node N2.

A first power supply voltage VDD is provided to the fourth node N4, a second power supply voltage VDD is provided to the sixth node N6, a third power supply voltage VDD is provided to the eighth node N8, and a fourth power supply voltage VSS is provided to the first node N1. Thus, an input clock IN is inputted into the ninth node N9, and an inverted output clock OUT is outputted from the seventh node N7.

Figure 13:
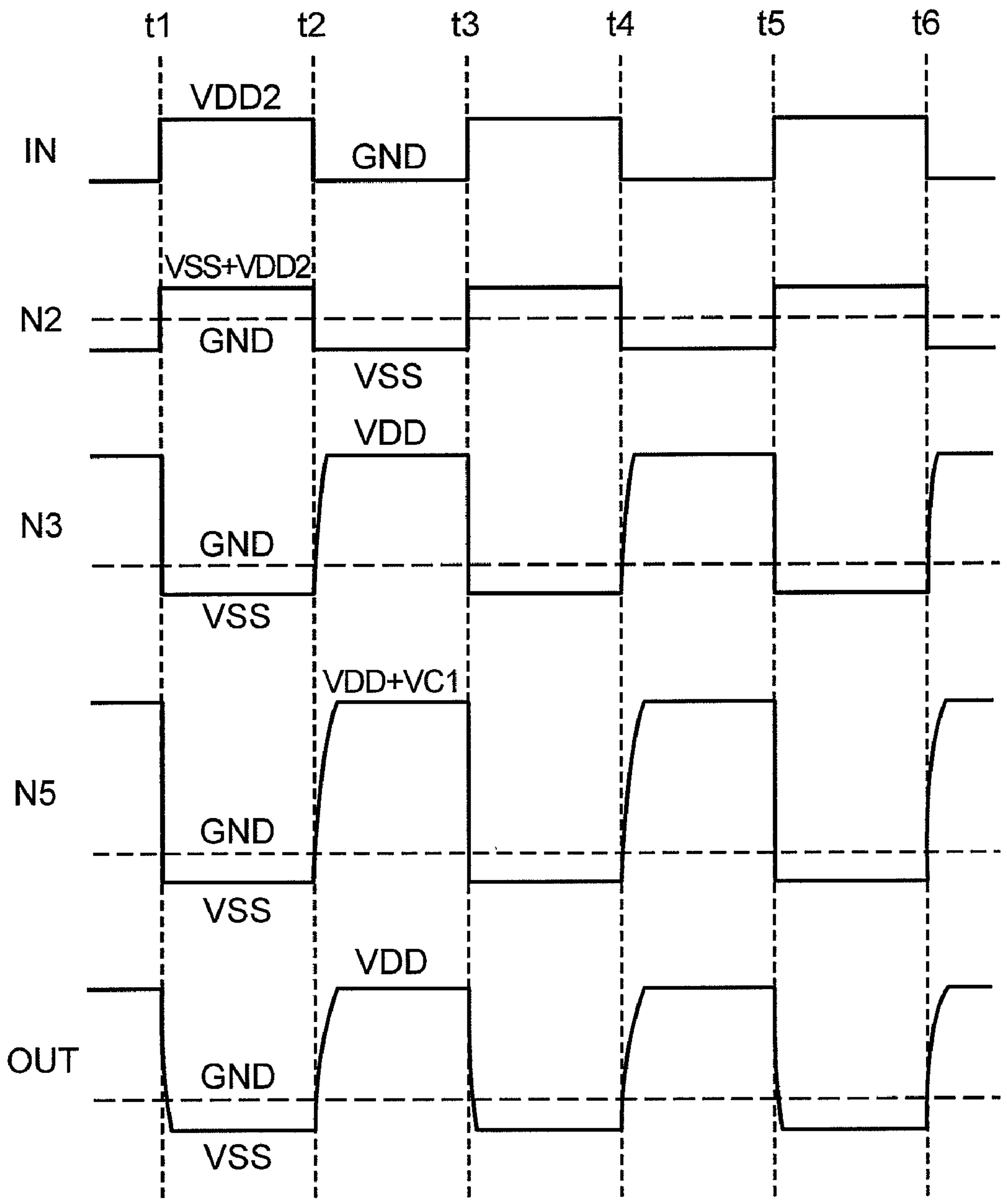
FIG. 13 is a diagram showing an input waveform and an output waveform of the level-shift inverter circuit 1101 shown in FIG. 12.

FIG. 13 is a diagram showing an input waveform and an output waveform of the level-shift inverter circuit 1101. Here, the driver LSI 209 shown in FIG. 1 outputs a control clock having an amplitude VDD2 whose high level is the VDD2 and whose low level is the GND, and the outputted control clock is provided as an input clock IN to the level-shift inverter circuit 1101.

In FIG. 13, first, the potential of the input clock IN is raised at the time t1. At that time, the potential of the node N2 is raised via the DC-cut capacitance C2. Thus, the Tr1 is turned on so that a current flows into the input inverter via the high-resistance load R. As a result, the potential of the node N3 is lowered down to almost the VSS so that the Tr2 is turned off. On the other hand, the Tr3 and Tr5 are turned on so that the potentials of the node N5 and output clock INB are lowered down to almost the VSS.

Subsequently, the potential of the input clock IN is lowered at the time t2. At that time, the potential of the node N2 is raised via the DC-cut capacitance C2. Thus, the Tr1 is turned off so that the current in the input inverter becomes almost zero. As a result, the potential of the node N3 is raised up to the power supply voltage VDD. At that time, the Tr6 is turned on so that the potential of the node N3 is lowered down to the VSS. Also, the Tr3 and Tr5 are turned off. Conversely, a rise in potential of the node N3 turns on the Tr2 so that the capacitance C1 is charged with the voltage VC1 via the Tr2. Thus, the Tr4 is turned on so that a current is provided to the load via the Tr4 with the voltage VC1 held by the capacitance C1. As a result, the potential of the node N5 is raised up to the VDD+VC1 and the potential of an output clock OUT is raised up to the VDD without being affected by the threshold voltage Vth of the Tr4. Although the potential of the node N5 becomes higher than the VDD at that time, the electric charge of the capacitance C1 does not leak via the Tr2 and the capacitance C1 holds the charged voltage VC1. This is because the Tr2 acts as a reverse bias. By repeating the above-described operations, an inverted clock OUT having a large amplitude that is a difference voltage VDD−VSS is obtained.

What is claimed is:

1. A display device comprising:

an insulating substrate;

a drive circuit on the insulating substrate, the drive circuit including an inverter circuit, the inverter circuit having:

first to fifth transistors of an identical conductivity type, each of the transistors including a semiconductor layer made of polycrystalline silicon; and a high-resistance element, wherein a first terminal of the first transistor is coupled to a first node, a gate terminal thereof is coupled to a second node, and a second terminal thereof is coupled to a third node, a first terminal of the second transistor is coupled to a fifth node, a gate terminal thereof is coupled to the third node, and a second terminal thereof is coupled to a sixth node, a first terminal of the third transistor is coupled to the first node, a gate terminal thereof is coupled to the second node, and a second terminal thereof is coupled to the fifth node, a first terminal of the fourth transistor is coupled to a seventh node, a gate terminal thereof is coupled to the fifth node, and a second terminal thereof is coupled to an eighth node, a first terminal of the fifth transistor is coupled to the first node, a gate terminal thereof is coupled to the second node, and a second terminal thereof is coupled to the seventh node, a first terminal of the high-resistance element is coupled to a fourth node and a second terminal thereof is coupled to the third node, a first power supply voltage is provided between the fourth node and first node, a second power supply voltage is provided between the sixth node and first node, a third power supply voltage is provided between the eighth node and first node, an input clock is inputted into the second node and an output clock obtained by inverting the input clock is outputted from the seventh node, the first power supply voltage is larger than a sum of the third power supply voltage and twice a threshold voltage of the transistors, and the second power supply voltage is larger than a sum of the third power supply voltage and the threshold voltage of the transistors.

2. A display device comprising an insulating substrate;

a drive circuit on the insulating substrate, the drive circuit including an inverter circuit, the inverter circuit having:

first to sixth transistors of an identical conductivity type, each of the transistors including a semiconductor layer made of polycrystalline silicon;

a high-resistance element; and first and second capacitance elements, wherein a first terminal of the first transistor is coupled to a first node, a gate terminal thereof is coupled to a second node, and a second terminal thereof is coupled to a third node, a first terminal of the second transistor is coupled to a fifth node, a gate terminal thereof is coupled to the third node, and a second terminal thereof is coupled to a sixth node, a first terminal of the third transistor is coupled to the first node, a gate terminal thereof is coupled to the second node, and a second terminal thereof is coupled to the fifth node, a first terminal of the fourth transistor is coupled to a seventh node, a gate terminal thereof is coupled to the fifth node, and a second terminal thereof is coupled to an eighth node, a first terminal of the fifth transistor is coupled to the first node, a gate terminal thereof is coupled to the second node, and a second terminal thereof is coupled to the seventh node, a first terminal of the high-resistance element is coupled to a fourth node and a second terminal thereof is coupled to the third node, a first terminal of the first capacitance element is coupled to the seventh node and a second terminal thereof is coupled to the fifth node, a first terminal of the second capacitance element is coupled to a ninth node and a second terminal thereof is coupled to the second node, a first terminal of the sixth transistor is coupled to the first node, a gate terminal thereof is coupled to the third node, fifth node, or seventh node, and a second terminal thereof is coupled to the second node, a first power supply voltage is provided to the fourth node, a second power supply voltage is provided to the sixth node, a third power supply voltage is provided to the eighth node, a fourth power supply voltage is provided to the first node, and an input clock is inputted into the ninth node and an output clock obtained by inverting the input clock is outputted from the seventh node.

3. The display device according to claim 2, wherein a difference between the third power supply voltage and fourth power supply voltage is larger than an amplitude of the input clock.

4. The display device according to any one of claims 2 and 3, wherein the first power supply voltage, second power supply voltage, and third power supply voltage are equal to one another.

5. A display device comprising:

an insulating substrate;

a drive circuit on the insulating substrate, the drive circuit including an inverter circuit, the inverter circuit having:

first to fifth transistors of an identical conductivity type, each of the transistors including a semiconductor layer made of polycrystalline silicon; and a high-resistance element, wherein a first terminal of the first transistor is coupled to a first node, a gate terminal thereof is coupled to a second node, and a second terminal thereof is coupled to a third node, a first terminal of the second transistor is coupled to a fifth node, a gate terminal thereof is coupled to the third node, and a second terminal thereof is coupled to a sixth node, a first terminal of the third transistor is coupled to the first node, a gate terminal thereof is coupled to the second node, and a second terminal thereof is coupled to the fifth node, a first terminal of the fourth transistor is coupled to a seventh node, a gate terminal thereof is coupled to the fifth node, and a second terminal thereof is coupled to an eighth node, a first terminal of the fifth transistor is coupled to the first node, a gate terminal thereof is coupled to the second node, and a second terminal thereof is coupled to the seventh node, a first terminal of the high-resistance element is coupled to a fourth node and a second terminal thereof is coupled to the third node, a first power supply voltage is provided between the fourth node and first node, a second power supply voltage is provided between the sixth node and first node, a third power supply voltage is provided between the eighth node and first node, an input clock is inputted into the second node and an output clock obtained by inverting the input clock is outputted from the seventh node, and the gate terminal of the second transistor is coupled to the third node without being coupled to the gate terminal of the fourth transistor, and gate terminal of the fourth transistor is coupled to the fifth node without being coupled to the gate terminal of the second transistor.

6. A display device comprising an insulating substrate;

a drive circuit on the insulating substrate, the drive circuit including an inverter circuit, the inverter circuit having:

first to fifth transistors of an identical conductivity type, each of the transistors including a semiconductor layer made of polycrystalline silicon; and a high-resistance element, wherein a first terminal of the first transistor is coupled to a first node, a gate terminal thereof is coupled to a second node, and a second terminal thereof is coupled to a third node, a first terminal of the second transistor is coupled to a fifth node, a gate terminal thereof is coupled to the third node, and a second terminal thereof is coupled to a sixth node, a first terminal of the third transistor is coupled to the first node, a gate terminal thereof is coupled to the second node, and a second terminal thereof is coupled to the fifth node, a first terminal of the fourth transistor is coupled to a seventh node, a gate terminal thereof is coupled to the fifth node, and a second terminal thereof is coupled to an eighth node, a first terminal of the fifth transistor is coupled to the first node, a gate terminal thereof is coupled to the second node, and a second terminal thereof is coupled to the seventh node, a first terminal of the high-resistance element is coupled to a fourth node and a second terminal thereof is coupled to the third node, a first power supply voltage is provided between the fourth node and first node, a second power supply voltage is provided between the sixth node and first node, a third power supply voltage is provided between the eighth node and first node, an input clock is inputted into the second node and an output clock obtained by inverting the input clock is outputted from the seventh node, and the gate terminal of the second transistor is only coupled to the third node, and the gate terminal of the fourth transistor is only coupled to the fifth node.

7. A display device comprising an insulating substrate;

a drive circuit on the insulating substrate, the drive circuit including an inverter circuit, the inverter circuit having:

first to fifth transistors of an identical conductivity type, each of the transistors including a semiconductor layer made of polycrystalline silicon:

a high-resistance element; and a capacitance element, wherein a first terminal of the first transistor is coupled to a first node, a gate terminal thereof is coupled to a second node, and a second terminal thereof is coupled to a third node, a first terminal of the second transistor is coupled to a fifth node, a gate terminal thereof is coupled to the third node, and a second terminal thereof is coupled to a sixth node, a first terminal of the third transistor is coupled to the first node, a gate terminal thereof is coupled to the second node, and a second terminal thereof is coupled to the fifth node, a first terminal of the fourth transistor is coupled to a seventh node, a gate terminal thereof is coupled to the fifth node, and a second terminal thereof is coupled to an eighth node, a first terminal of the fifth transistor is coupled to the first node, a gate terminal thereof is coupled to the second node, and a second terminal thereof is coupled to the seventh node, a first terminal of the high-resistance element is coupled to a fourth node and a second terminal thereof is coupled to the third node, a first terminal of the capacitance element is coupled to the seventh node and a second terminal thereof is coupled to the fifth node, a first power supply voltage is provided between the fourth node and first node, a second power supply voltage is provided between the sixth node and first node, a third power supply voltage is provided between the eighth node and first node, an input clock is inputted into the second node and an output clock obtained by inverting the input clock is outputted from the seventh node, and the gate terminal of the second transistor is coupled to the third node without being coupled to the gate terminal of the fourth transistor, and gate terminal of the fourth transistor is coupled to the fifth node without being coupled to the gate terminal of the second transistor.

8. A display device comprising an insulating substrate;

a drive circuit on the insulating substrate, the drive circuit including an inverter circuit, the inverter circuit having:

first to fifth transistors of an identical conductivity type, each of the transistors including a semiconductor layer made of polycrystalline silicon:

a high-resistance element; and a capacitance element, wherein a first terminal of the first transistor is coupled to a first node, a gate terminal thereof is coupled to a second node, and a second terminal thereof is coupled to a third node, a first terminal of the second transistor is coupled to a fifth node, a gate terminal thereof is coupled to the third node, and a second terminal thereof is coupled to a sixth node, a first terminal of the third transistor is coupled to the first node, a gate terminal thereof is coupled to the second node, and a second terminal thereof is coupled to the fifth node, a first terminal of the fourth transistor is coupled to a seventh node, a gate terminal thereof is coupled to the fifth node, and a second terminal thereof is coupled to an eighth node, a first terminal of the fifth transistor is coupled to the first node, a gate terminal thereof is coupled to the second node, and a second terminal thereof is coupled to the seventh node, a first terminal of the high-resistance element is coupled to a fourth node and a second terminal thereof is coupled to the third node, a first terminal of the capacitance element is coupled to the seventh node and a second terminal thereof is coupled to the fifth node, a first power supply voltage is provided between the fourth node and first node, a second power supply voltage is provided between the sixth node and first node, a third power supply voltage is provided between the eighth node and first node, an input clock is inputted into the second node and an output clock obtained by inverting the input clock is outputted from the seventh node, and the gate terminal of the second transistor is only coupled to the third node, and the gate terminal of the fourth transistor is only coupled to the fifth node.

* * * * *